(12) United States Patent
Sefi

(10) Patent No.: US 11,489,486 B2
(45) Date of Patent: Nov. 1, 2022

(54) DEVICE AND METHOD FOR CLEANING SOLAR PANEL ARRAYS

(71) Applicant: Yoel Sefi, Kibbutz Malkiya (IL)

(72) Inventor: Yoel Sefi, Kibbutz Malkiya (IL)

(73) Assignee: DUSTOSS LTD., Har Adar (IL)

( * ) Notice: Subject to any disclaimer, the term of this patent is extended or adjusted under 35 U.S.C. 154(b) by 226 days.

(21) Appl. No.: 16/317,569

(22) PCT Filed: Jul. 19, 2017

(86) PCT No.: PCT/IL2017/050815
§ 371 (c)(1),
(2) Date: Jan. 14, 2019

(87) PCT Pub. No.: WO2018/015955
PCT Pub. Date: Jan. 25, 2018

(65) Prior Publication Data
US 2019/0280645 A1    Sep. 12, 2019

Related U.S. Application Data

(60) Provisional application No. 62/363,862, filed on Jul. 19, 2016.

(51) Int. Cl.
| | | |
|---|---|---|
| H02S 40/10 | (2014.01) | |
| B08B 7/02 | (2006.01) | |
| B08B 1/00 | (2006.01) | |
| F24S 40/20 | (2018.01) | |
| F24S 40/40 | (2018.01) | |
| H01L 31/05 | (2014.01) | |

(52) U.S. Cl.
CPC ............... *H02S 40/10* (2014.12); *B08B 1/00* (2013.01); *B08B 1/005* (2013.01); *B08B 7/02* (2013.01); *F24S 40/20* (2018.05); *F24S 40/40* (2018.05); *H01L 31/05* (2013.01); *Y02E 10/40* (2013.01)

(58) Field of Classification Search
CPC ............ H02S 40/10; F24S 40/20; F24S 40/40
See application file for complete search history.

(56) References Cited

U.S. PATENT DOCUMENTS

| | | | | |
|---|---|---|---|---|
| 5,679,067 A | * | 10/1997 | Johnson | ............... A46B 3/005 451/527 |
| 2010/0119765 A1 | * | 5/2010 | Kabis | ............... G06K 13/0893 428/90 |
| 2017/0089610 A1 | * | 3/2017 | Simonette | ............... F24S 40/20 |

FOREIGN PATENT DOCUMENTS

| | | |
|---|---|---|
| CN | 103364949 A | 10/2013 |
| CN | 104034059 A | 9/2014 |
| GB | 2504530 B | 2/2014 |

OTHER PUBLICATIONS

Machine translation of Yu et al as cited in the ISR.*

* cited by examiner

*Primary Examiner* — Bethany L Martin
(74) *Attorney, Agent, or Firm* — Mark M. Friedman

(57) ABSTRACT

Devices and methods for cleaning an array of solar panels in side-by-side relation employ one or more elongated flexible elements, preferably implemented as translucent strips (14a, 14b, 14c, 14d), anchored at their ends relative to the array of solar panels (12). Each strip spans two or more solar panels, and is wind-displaceable so as to contribute to cleaning of at least two of the solar panels (12).

24 Claims, 7 Drawing Sheets

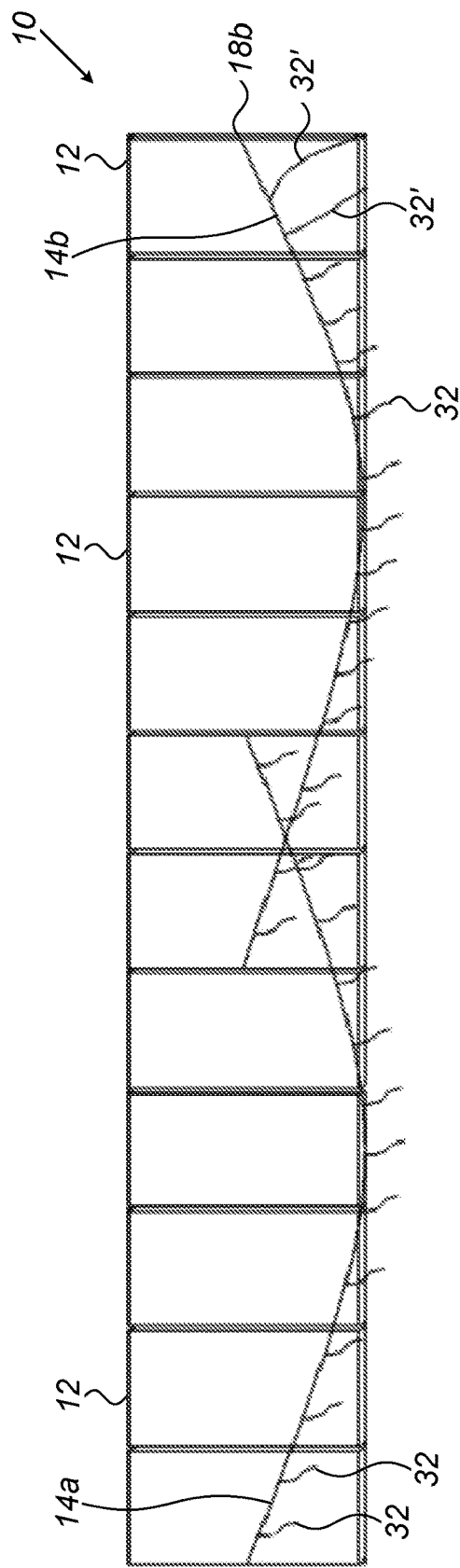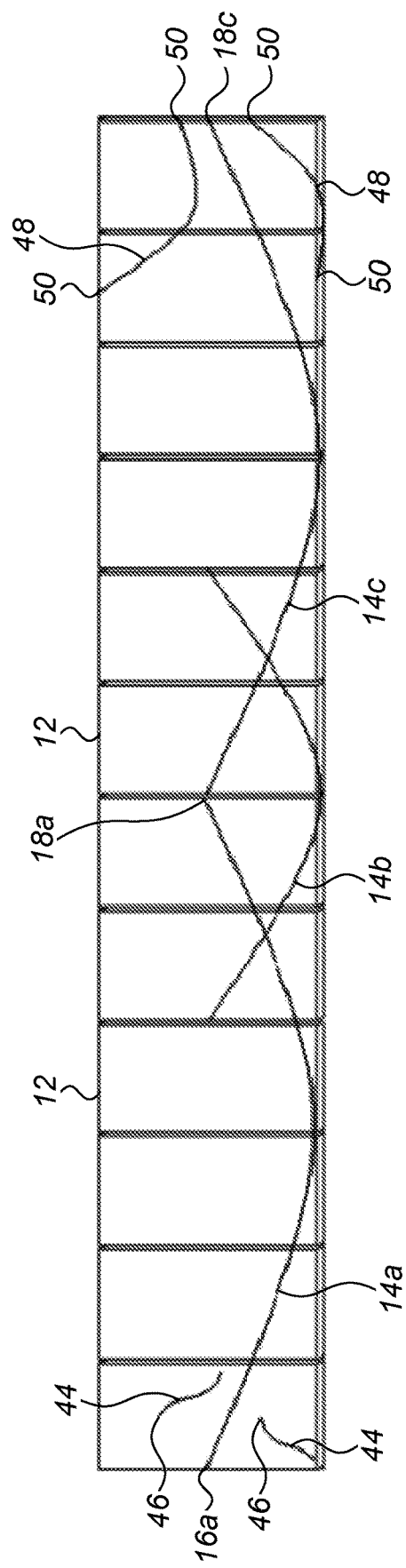
FIG. 2A
FIG. 2B

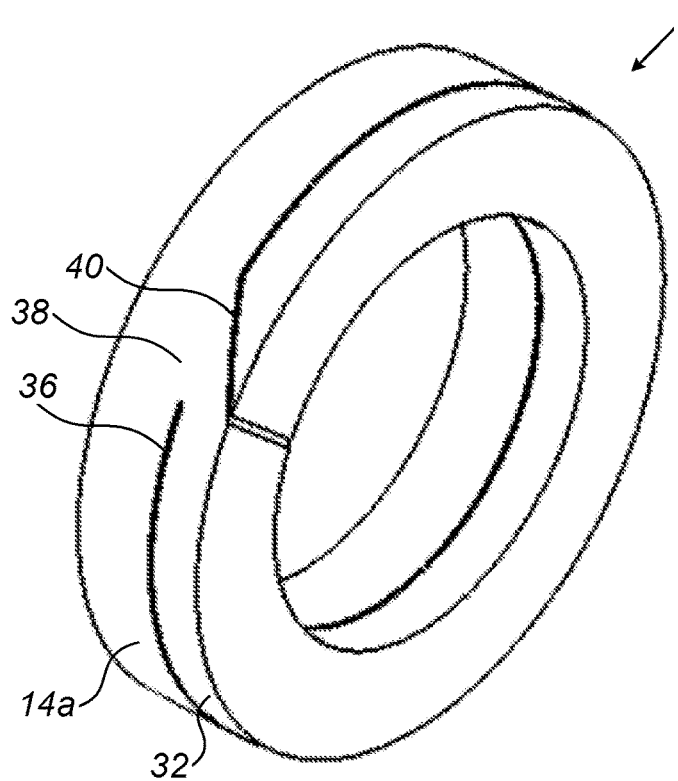
FIG.3A
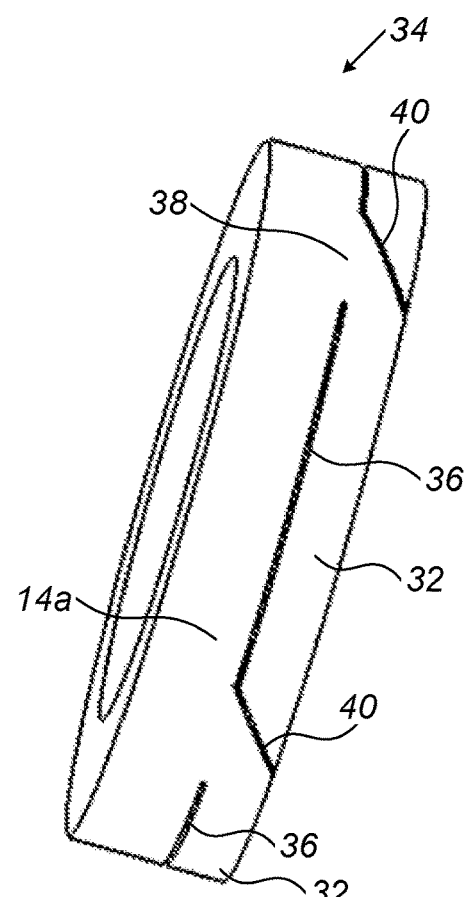
FIG.3C
FIG.3B
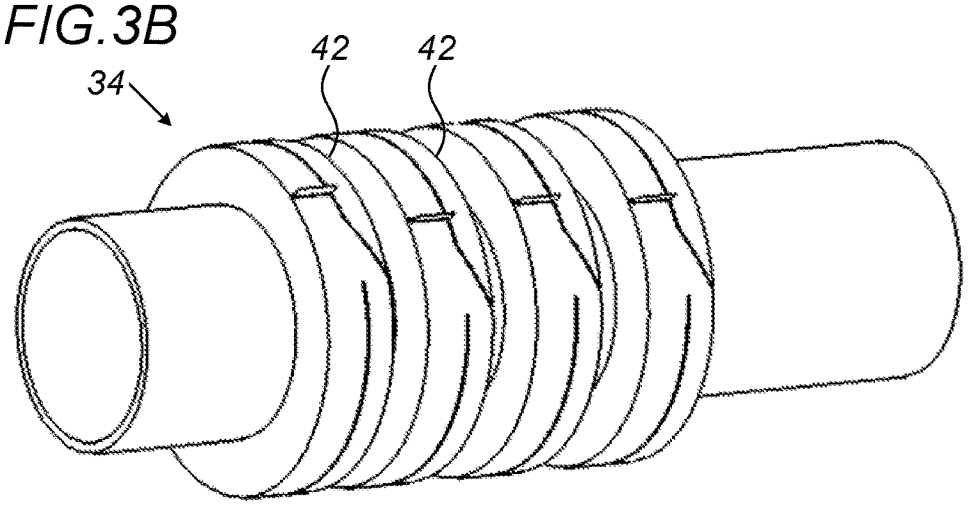

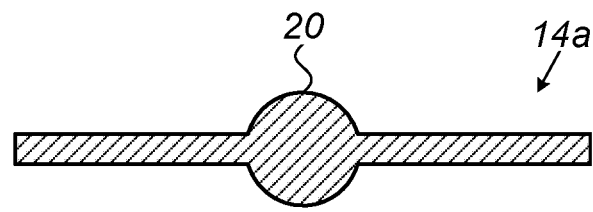
FIG. 8A
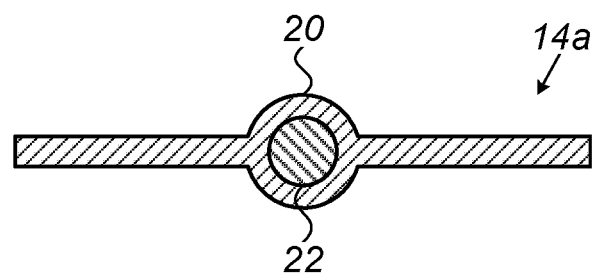
FIG. 8B
FIG. 9
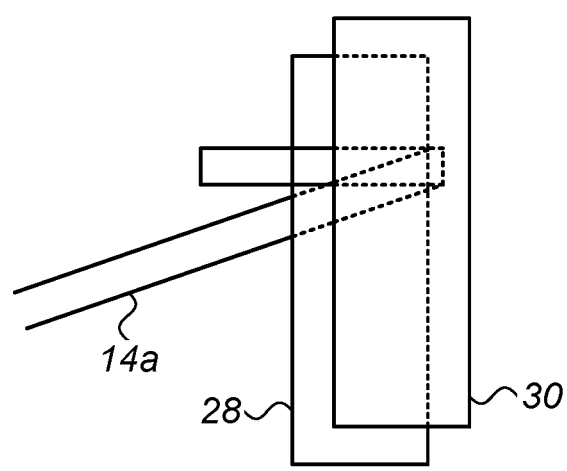

DEVICE AND METHOD FOR CLEANING SOLAR PANEL ARRAYS

FIELD AND BACKGROUND OF THE INVENTION

The present invention relates to devices and methods for reducing accumulation of dirt on arrays of solar panels.

In recent years, use of solar energy has become increasingly prevalent. The prices of photoelectric panels have decreased, making them a resource available to many, and bringing the cost of solar energy down to levels comparable with that provided by power companies. However, the actual costs of solar energy production differ from theoretical calculations due to various considerations, and in particular, tend to deteriorate over time with accumulation of dust and dirt on the panels.

SUMMARY OF THE INVENTION

The present invention is a method, device and system for cleaning an array of solar panels.

According to the teachings of an embodiment of the present invention there is provided, a method for cleaning an array of solar panels, each solar panel having a solar collecting area having a height and a width, the array of solar panels including a plurality of panels in side-by-side relation, the method comprising the steps of: (a) providing an elongated flexible element, preferably implemented as a translucent strip; (b) anchoring a first region and a second region of the strip relative to the array of solar panels so that a portion of the strip between the first and second regions spans a plurality of the solar panels, wherein the portion of the strip is configured to be wind-displaceable so as to contribute to cleaning of at least two of the solar panels.

There is also provided according to the teachings of an embodiment of the present invention, a system comprising: (a) an array of solar panels, each solar panel having a solar collecting area having a height and a width, the array of solar panels including a plurality of panels in side-by-side relation; and (b) an elongated flexible element, preferably implemented as a translucent strip, anchored to the array of solar panels at a first region and a second region so that a portion of the strip between the first and second regions spans a plurality of the solar panels, wherein the portion of the strip is configured to be wind-displaceable so as to contribute to cleaning of at least two of the solar panels.

According to a further feature of an embodiment of the present invention, a length of the strip between the anchoring locations sufficient to allow a range of motion of the strip that reaches a majority of the solar collecting area of at least two of the solar panels.

According to a further feature of an embodiment of the present invention, a length of the strip between the anchoring locations sufficient such that, when the strip hangs in a smooth curve between the anchoring locations, the strip reaches a lower edge of the solar collecting area of at least one of the solar panels and, when inverted to an upwardly deflected smooth curve, the strip reaches an upper edge of the solar collecting area of at least one of the solar panels.

According to a further feature of an embodiment of the present invention, a length of the strip between the anchoring locations sufficient such that, when the strip hangs in a smooth curve between the anchoring locations, at least part of the strip lies beyond a lower edge of the solar collecting area of at least one of the solar panels.

According to a further feature of an embodiment of the present invention, the strip supports a plurality of branch strips spaced apart along a length of the strip.

According to a further feature of an embodiment of the present invention, the branch strips are provided integrally formed with the strip as a cut roll of translucent material.

According to a further feature of an embodiment of the present invention, the strip has a width and a minimum thickness, the width being at least 50 times greater than the minimum thickness.

According to a further feature of an embodiment of the present invention, the strip includes a longitudinal reinforcement extending along an entire length of the portion of the strip between the anchoring locations.

According to a further feature of an embodiment of the present invention, the longitudinal reinforcement is implemented as a region of increased thickness integrally formed with the strip, the region of increased thickness having a rounded cross-sectional shape having a diameter at least twice the minimum thickness of the strip.

According to a further feature of an embodiment of the present invention, the longitudinal reinforcement is implemented as a reinforcing filament coextensive with and interconnected with the strip.

According to a further feature of an embodiment of the present invention, the portion of the strip between the anchoring locations includes a medial part interconnected at both ends by a connecting portion to the anchoring locations, wherein the medial part has a first cross-sectional shape, and wherein the connecting portions have a modified cross-sectional shape differing from the first cross-sectional shape.

According to a further feature of an embodiment of the present invention, the strip is referred to as the first strip, first and second regions of a second strip are anchored relative to the array of solar panels, wherein the first strip spans at least two panels the second strip spans at least two panels, and wherein the spans of the first and second strips overlap by an overlap length, the overlap length being at least one panel width, no more than half the span of the first strip and no more than half the span of the second strip.

There is also provided according to the teachings of an embodiment of the present invention, a device for cleaning an array of solar panels comprising: (a) an elongated translucent strip; (b) an anchoring arrangement for anchoring the strip to the array of solar panels so that a portion of the strip between the first and second regions spans a plurality of the solar panels, wherein the portion of the strip is configured to be wind-displaceable so as to contribute to cleaning of at least two of the solar panels, and wherein the strip supports a plurality of branch strips spaced apart along a length of the strip.

According to a further feature of an embodiment of the present invention, the branch strips are integrally formed with the strip as a cut roll of translucent material.

There is also provided according to the teachings of an embodiment of the present invention, a device for cleaning an array of solar panels comprising: (a) an elongated translucent strip; (b) an anchoring arrangement for anchoring the strip to the array of solar panels so that a portion of the strip between the first and second regions spans a plurality of the solar panels, wherein the portion of the strip is configured to be wind-displaceable so as to contribute to cleaning of at least two of the solar panels, and wherein the strip includes a longitudinal reinforcement extending along an entire length of the portion of the strip between the anchoring locations.

According to a further feature of an embodiment of the present invention, the longitudinal reinforcement is implemented as a region of increased thickness integrally formed with the strip, the region of increased thickness having a rounded cross-sectional shape having a diameter at least twice the minimum thickness of the strip.

According to a further feature of an embodiment of the present invention, the longitudinal reinforcement is implemented as a reinforcing filament coextensive with and interconnected with the strip.

BRIEF DESCRIPTION OF THE DRAWINGS

The invention is herein described, by way of example only, with reference to the accompanying drawings, wherein:

FIGS. 2A-2C are views similar to FIG. 1 showing variant implementations of the cleaning devices or supplements thereto;

FIGS. 3A-3C are schematic isometric views illustrating a manufacturing technique and corresponding implementation of a device similar to that of FIG. 2A;

FIGS. 8A and 8B are cross-sectional views taken through a strip suitable for use in the devices of the present invention; and FIG. 9 is a schematic representation of an anchoring configuration according to an embodiment of the present invention.

DESCRIPTION OF THE PREFERRED EMBODIMENTS

The present invention is a method, device and system for cleaning an array of solar panels.

The principles and operation of devices, systems and methods according to the present invention may be better understood with reference to the drawings and the accompanying description.

Figure 1:
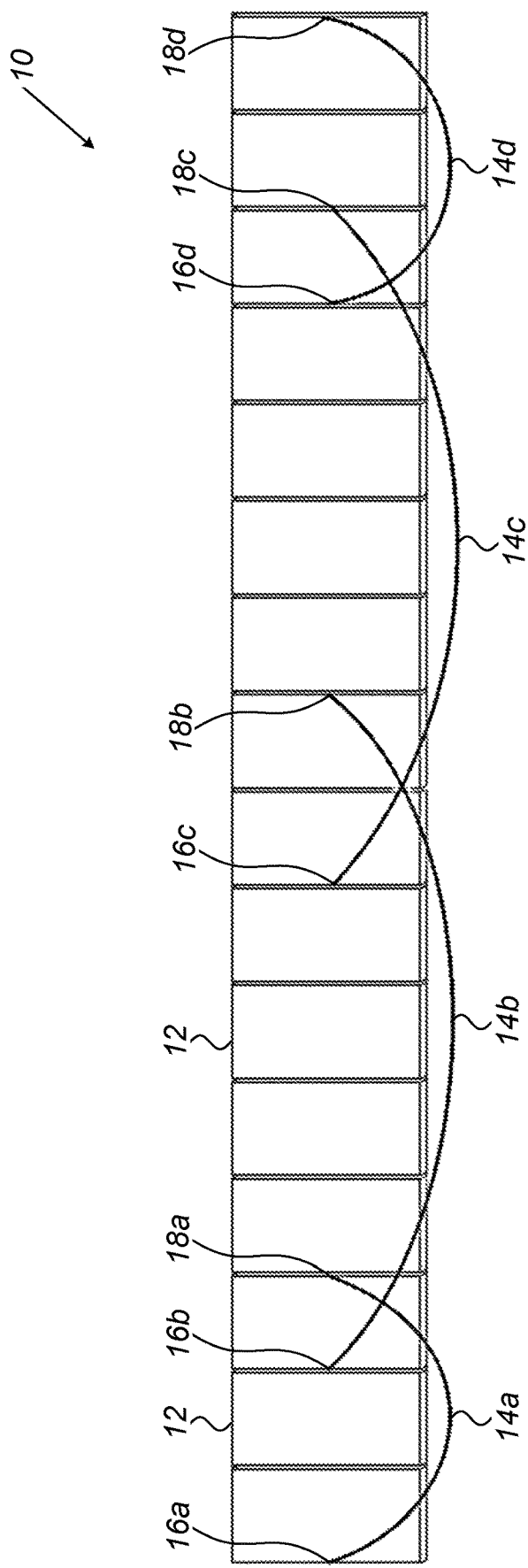
FIG. 1 is a schematic representation of a system including an array of solar panels provided with cleaning devices for cleaning the panels according to an embodiment of the present invention.

Referring now to the drawings, FIGS. 1-8B illustrate various devices and methods for cleaning an array of solar panels. Referring first to FIG. 1, this shows a system, generally designated 10, constructed and operative according to the teachings of an embodiment of the present invention, in which one or more devices are deployed to clean an array of solar panels 12 in side-by-side relation. In general terms, each device is implemented as an elongated flexible element, preferably implemented as a translucent strip 14a, 14b, 14c, 14d of which first and second regions, typically near its ends, are anchored relative to the array of solar panels 12 at locations 16a, 16b, 16c, 16d and 18a, 18b, 18c, 18d, respectively, so that a portion of each strip between the regions spans a plurality of the solar panels. The portion of each strip between the regions that are anchored is referred to herein as the "free length" of the strip. At least the free length of the strip is configured to be wind-displaceable so as to contribute to cleaning of at least two of solar panels 12.

In the particularly preferred but non-limiting implementation illustrated here, some or all of strips 14a, 14b, 14c, 14d are anchored with a free length that is greater than the distance between the anchoring regions, and most preferably sufficiently long to allow a range of motion of the strip that reaches a majority of the solar collecting area of at least two of said solar panels. In certain particularly preferred but non-limiting implementations, the free length of some or all of the strips is sufficient such that, when the strip hangs in a smooth curve between the anchoring locations, the strip reaches a lower edge of the solar collecting area of at least one of the solar panels and, when inverted to an upwardly deflected smooth curve, the strip reaches an upper edge of the solar collecting area of at least one of the solar panels. In certain preferred cases, the free length and the anchoring locations are chosen such that, when the strip hangs in a smooth curve between the anchoring locations, at least part of the strip lies beyond a lower edge of the solar collecting area of at least one of the solar panels, as illustrated in FIG. 1, thereby ensuring that at least part of the strip, when at rest, does not contribute to shading of the solar panel surface.

At this stage, it will already be apparent that certain embodiments of the present invention provide a range of advantages. Firstly, the devices of the present invention are low-cost and low maintenance devices, displaced by ambient wind conditions without requiring any additional power source or infrastructure. Additionally, by employing devices which each span a plurality of panels, a relatively small number of devices is effective to span an array of solar panels, thereby rendering the devices easy to deploy, reducing costs and labor compared to individual panel cleaning arrangements. These and other advantages of certain embodiments of the present will be better understood with reference to the following drawings and accompanying description.

At this point, it will be useful to define certain terminology as used herein in the description and claims. Firstly, the term "cleaning" is used herein to refer to any process which prevents, or reduces, accumulation of dirt on a surface by dislodging dirt. The invention relates particularly, although not exclusively, to dislodging of airborne particles that are deposited on surfaces, including but not limited to, various types of dust, sand, airborne fibers, and pollen.

The term "translucent" is used to refer to an element or material which allows passage of a majority of incident radiation, at least in the optical range of the spectrum. This includes both transparent materials and materials which have optically distortive effects. The translucent elements of the present invention preferably allow passage of at least 60% of the incident light, more preferably at least 80%, and in most preferred cases, in excess of 90%.

The devices of the present invention are described as "configured to be wind-displaceable". "Wind-displaceable" refers herein to a device which is readily displaced by air movement, most preferably even under gentle breeze conditions. A number of different factors preferably contribute to and/or define the desired properties. A useful criterion in defining this property in at least certain implementations of the invention is that the terminal velocity of the device, i.e., the air flow rate at which the air drag force balances the vertical gravitational pull on the device, is preferably no greater than about 5 meters per second, and typically in the range of 1-3 meters per second. As a result, relatively gentle gusts of wind are effective to displace the device, even against gravity and frictional forces, to reach all parts of a locus of contact points. Under conditions of stronger wind, the device typically flutters rapidly and buffets against the surface, achieving a rapid and effective mechanical cleaning action which may on occasion be further enhanced by the presence of water from precipitation or dew. Full coverage of the cleaning effect across the area of the panel surface is ensured by variations in wind conditions, which may be transient gusts or direction changes, or may occur on a longer time scale during varying weather conditions over a period of days or weeks. In many cases, irregular obstacles to wind flow that are posed by panels 12 themselves, or by associated or unrelated obstacles nearby, may result in eddy currents or other forms of turbulence which may enhance effective cleaning of the entire panel surface. It has been found that the fluttering effect of a strip anchored at both ends, even under relatively uniform wind conditions, typically introduces sufficient instability to reach all regions of the locus of contact, even without reversal of wind direction.

Certain particularly preferred implementations of the present invention have been found to be particularly effective when implemented using a strip of material having a general thickness in the range of 20-100 microns, and most preferably 40-80 microns, and a strip width of 3-20 millimeters, and most preferably, 5-15 millimeters. The optimum values are chosen according to mechanical properties of the material used in combination with requirements of strength and flexibility, while minimizing shading effects of the strip. The width is in most cases at least 50 times greater than the minimum thickness of the strip.

A wide range of materials are suitable for implementing the strips of the present invention. A few particularly preferred but non-limiting options include: polyethylene (PE); polyethylene terephthalate (PET); polycarbonate (PC); polypropylene (PP); and polyvinyl chloride (PVC). The material chosen must be stable under extended periods of exposure to sunlight, which may require additives or surface treatments which provide ultraviolet (UV) absorption, as is known in the art of plastic product manufacture for outdoor use. Manufacturing techniques are chosen according to the material used, as is known in the art, and may include various techniques known in the art for producing sheet materials, followed by one or more cutting process. Other processes, such as extrusion, may also be used.

In tests performed using PE strips, it has been found highly effective to employ a PE UV-resistant strip of thickness about 40 microns and width 12 millimeters. In test using an array of panels with these strips compared to an identical array of panels without the strips, the average power output of the non-cleaned array was found to drop by 11 percent over a given period compared with the output of the newly-installed clean array, whereas the average power output of the array with the device of the present invention installed was found to drop by only 3 percent over the same period. This 3 percent drop is attributable to the combined effects of some incomplete cleaning together with some shading effect of the device itself. The shading effect of the device itself may be further minimized by various additional steps described herein, such as, for example, allowing part of the strip to hang down outside the active area of the solar panel, as illustrated in FIG. 1, and use of reduced width connecting portions discussed below.

In some cases, in order to enhance the longevity of the strips under repeated flexion and variable tension, it may be preferable to implement the strip 14a with a longitudinal reinforcement 20 extending along the entire free length of the strip between the anchoring locations, as illustrated schematically in FIGS. 8A and 8B. According to a first preferred option illustrated in FIG. 8A, longitudinal reinforcement 20 is implemented as a region of increased thickness integrally formed with strip 14a, where the region of increased thickness preferably has a rounded cross-sectional shape having a diameter at least twice, and typically 3 or more times, the minimum thickness of the strip. In an alternative preferred implementation illustrated in FIG. 8B, longitudinal reinforcement 20 is implemented as a reinforcing filament 22 coextensive with and interconnected with the strip. In the example of FIG. 8B, reinforcing filament 22 is continuously integrated with the strip, for example, during a coextrusion process. Alternatively, a reinforcing filament may be external to the strip along at least part of its length, and be interconnected with the strip intermittently along its length.

Although described primarily herein with reference to a translucent strip as a particularly preferred implementation, it should be noted that the principles of the present invention may also be implemented using a range of other elongated flexible elements that are suitable to be displaced by wind to achieve cleaning of the surfaces of the solar panels. Other examples include, but are not limited to, various opaque, or semi-opaque, strips, with or without reinforcements, and various lightweight brush structures.

In certain cases, it may be advantageous to provide a variable cross-section shape (proportions or dimensions) along the length of the strip. For example, in the case illustrated schematically in FIG. 5, the free length of strip 14a includes a medial part 24 interconnected at both ends by a connecting portion 26 to the anchoring locations 16a and 18a, where medial part 24 has a first cross-sectional shape, and connecting portions 26 have a modified cross-sectional shape differing from the first cross-sectional shape. This option accommodates separate optimization of the properties of the different parts of the strip: the medial part which performs the primary cleaning action and is preferably constructed according to one of the options described above; and the connecting portions close to the anchoring locations, where the motion is not sufficient to contribute significantly to cleaning effect, and the primary considerations thus become reduction of any shading effect while maintaining sufficient mechanical strength and flexibility to ensure reliable anchoring of the device. Where a longitudinal reinforcement is used, such as described above with reference to FIGS. 8A and 8B, connecting portions 26 may optionally be implemented as an extension of the reinforcing configuration without the remainder of the strip. The transition between the different cross-sectional shapes may be a gradual transition, and may extend along a significant proportion of the length of the element.

Anchoring of the strips at anchoring locations 16a, 16b, 16c, 16d and 18a, 18b, 18c, 18d, may be implemented by any suitable anchoring arrangement. According to one exemplary but non-limiting example, a particularly simple and effective form of attachment is illustrated schematically in FIG. 9, where an end portion of strip 14a is secured under a first piece of weatherproof adhesive tape 28, and is then folded back over the first piece of tape and secured with a second piece of weatherproof adhesive tape 30. Optionally, the tape may be transparent tape. However, most preferably, anchoring of the strips of the present invention is performed outside the solar-collecting area of the panels, for example, on a front surface or peripheral surface of an outer frame of the panel, such that the use of opaque tape is also acceptable. Other optional implementations may employ attachment configurations secured by adhesive directly to the panel, or by a suction-grip pad. Where a panel is designed for integration with the devices of the present invention as a self-cleaning solar panel array system according to the present invention, an attachment configuration (such as a loop) may optionally be integrated with the panel during manufacture in order to facilitate connection of the devices.

Figure 2C:
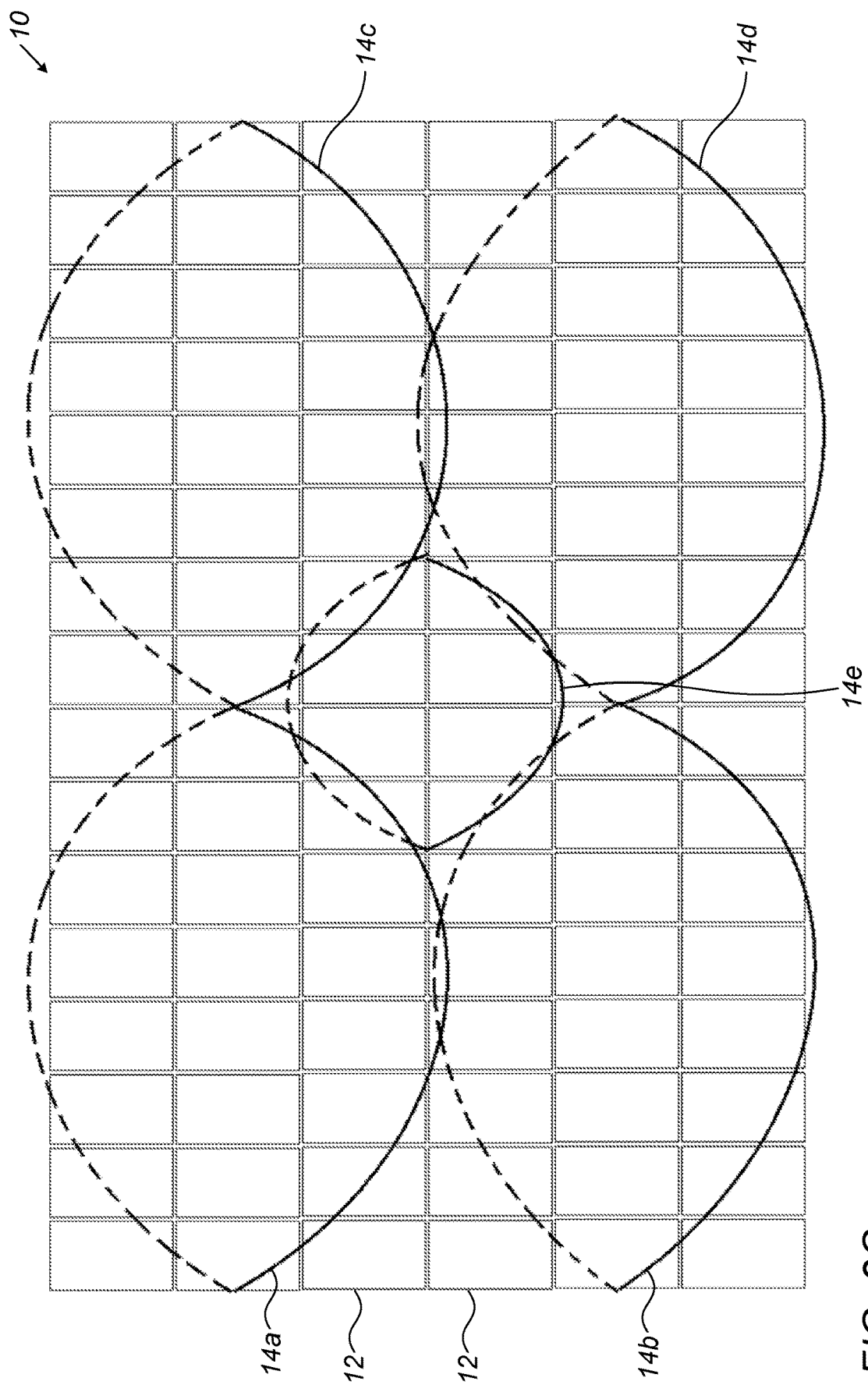

The attachment of each strip between two anchoring locations with a free length longer than the distance between the anchoring locations defines a locus of points on the surface of the panel which can be reached during wind-induced movements of the strip. To illustrate this concept, FIG. 2C illustrates schematically the locus of coverage of five strips 14a-14e deployed on an extended two-dimensional array of solar panels 12. In each case, a solid line represents the smoothly curved "hanging" state in which the strip will typically rest, while a dashed line represents an inverted state where the strip is raised along its entire length by an upward breeze. In practice, the strip typically undergoes continuous, rapid and unpredictable motion during wind conditions from a breeze upwards which cause it over a period of time to brush against all regions between these two curves, and somewhat beyond those curves, due to asymmetrical perturbations of the curved shape.

It will be noted that the effective area cleaned by each strip is relatively limited near the anchoring locations towards the end of the strip. Accordingly, particularly preferred implementations of the present invention provide various arrangements to supplement cleaning of the solar panel areas near the ends of the strips. Various such solutions will now be discussed.

Referring firstly to FIG. 1, this illustrates an approach according to which partial overlap is provided between the lengths of the array spanned by successive strips. Specifically, the spans of two strips may advantageously be arranged so that they overlap by an overlap length, which is preferably at least one panel width, and preferably no more than half the span of each of the individual strips. Thus, in the example of FIG. 1, strips 14a and 14b, which span respectively 3 and 7 panels, overlap by one panel width. Strips 14b and 14c, which each span 7 panels, overlap by two panel widths. As a result of the overlap, the region closest to the anchoring location of each strip is additionally cleaned by a neighboring strip at a location further from the anchoring location of the neighboring strip, thereby achieving enhanced cleaning effect coverage. By keeping the overlap to no more than half of the length, and preferably no more than a third of the length, it has been found that complications of tangling together of the strips are usually avoided.

A variant application of the overlap concept is illustrated in FIG. 2C. In this case, a strip 14e is deployed between anchoring locations which are in overlap along the "length" direction of the array with the four other strips shown, and additionally has a "vertical" offset. "Vertical" in this context refers to a direction along the surface of the panels which "up" or "down" along the panel, typically corresponding to a direction parallel to an edge of the panel which is inclined. This additional degree of freedom in relative positioning of the devices allows the extent of overall coverage of the cleaning effect for a given number of devices to be further optimized. Thus, in the example shown here, a single additional strip is effective to clean substantially the entire area which falls between the cleaning coverage of four adjacent strips. A similar approach may be implemented using two staggered rows of devices.

Parenthetically, FIG. 2C also exemplifies a different type of overlap in which strips 14a and 14b are co-extensive over a majority, or the entirety, of their length, but are sufficiently separated in the vertical direction to minimize risk of tangling of the strips. For example, if the maximum extent of overlap between the solid and dashed lines in the figure as shown is maintained as less than 10%, and more preferably 5%, the chances of the strips becoming entangled in a manner that does not immediately release itself are typically minimal.

FIG. 2A illustrates a further optional feature of certain preferred embodiments of the present invention according to which strips 14a and 14b each supports a plurality of branch strips 32 spaced apart part or all of a length of the strip. Branch strips 32 are typically formed from a material similar to the main strip from which they branch off, and may be integrally formed as part of the main strip. The branch strips flap independently in the wind, extending the reach of the device beyond the area reached by the main strip so that each device cleans a greater area.

According to one particularly advantageous implementation, branch strips 32 are provided integrally formed with the main strip as a cut roll of translucent material, as illustrated in FIGS. 3A-3C. Specifically, FIG. 3A shows a roll 34 of translucent material of a type suitable for implementing strips 14a etc. (as defined above), which has been cut along a radial cut 36 passing through all layers of the roll, and extending around a majority of the periphery of the roll, leaving a branching region 38 uncut. A further cut 40 connects from one side of branching region 38 to a side of the roll. The result of this structure is that one side of roll 34 remains continuous to form the main strip, and the other side of the roll opens up so that each turn of the roll forms a separate branch strip hanging from the main strip. FIG. 3B illustrates that this production technique can be combined with production of rolls 34 which themselves are typically cut using a roll-separating cut 42 from a broader roll of translucent material produced by standard sheet production techniques.

FIG. 3C illustrates a variant implementation of roll 34 in which each layer of the roll is cut with a number of shorter radial cuts 36 and lateral cuts 40 to form a plurality of shorter branch strips 32 for each turn of the roll.

It will be noted that the branch strips are not necessarily all of the same length. In fact, in the implementation options of FIGS. 3A-3C, there is inherently a variation in both the length of the branch strips and in the spacing of the branch strips along the main strip, since the length of each successive layer extending around the roll varies with the radial position of the layer on the roll.

In other cases, where other manufacturing techniques are used which allow for individual cutting of branch strips 32, the branch strips may be varied according to specific design considerations to compensate for other regions which would otherwise be difficult to provide with an effective cleaning action. This is particularly relevant near the attachment locations of the strips, and most particularly, near the ends of the array of solar panels 12. One such example is illustrated at the right end of FIG. 2A, where a number of branch strips 32' of length greater than the rest of branch strips 32 are provided near the anchoring location 18b. The length is preferably chosen in order to allow branch strips 32' to reach the extremities of the active area of the end panel 12, despite the limited range of motion of the main strip 14b near the anchoring location.

Turning now to FIG. 2B, this illustrates two further options for enhancing the cleaning effect of the invention near the ends of the main strips. According to one option, illustrated at the left end of FIG. 2B, the cleaning effect for one or more panels 12 at the end of the array, and/or at other locations along the array, is supplemented by one or more additional strip 44 anchored relative to the panel, typically at an anchor location 46 on the surface of the solar panel. In this case, strips 44 are illustrated as strips with a free end, functionally similar to branch strips 32, and deployed so that, in combination, they can reach a majority, if not all, of the surface of the panel. Anchoring of a strip on the panel surface can be achieved using transparent adhesive tape, suction cups, or other transparent adhesives.

The right end of FIG. 2B illustrates an alternative implementation in which additional strips 48 are suspended between two anchor locations 50, with the positions of the anchor locations and the free length of the strips chosen to enhance reach of strips 48 to the regions not accessible to the main strip 14c. In the particularly preferred example illustrated here, one anchor location 50 is along the top or bottom edge of the array of panels, while the other anchor location 50 is on the side of the end panel. The length of the free portion of strip 48 between the anchors is chosen to allow the strip to reach close to the corner and complement the area coverage of the main strip 14c, but without risk of passing over the corner and falling behind the panels.

Figure 4:
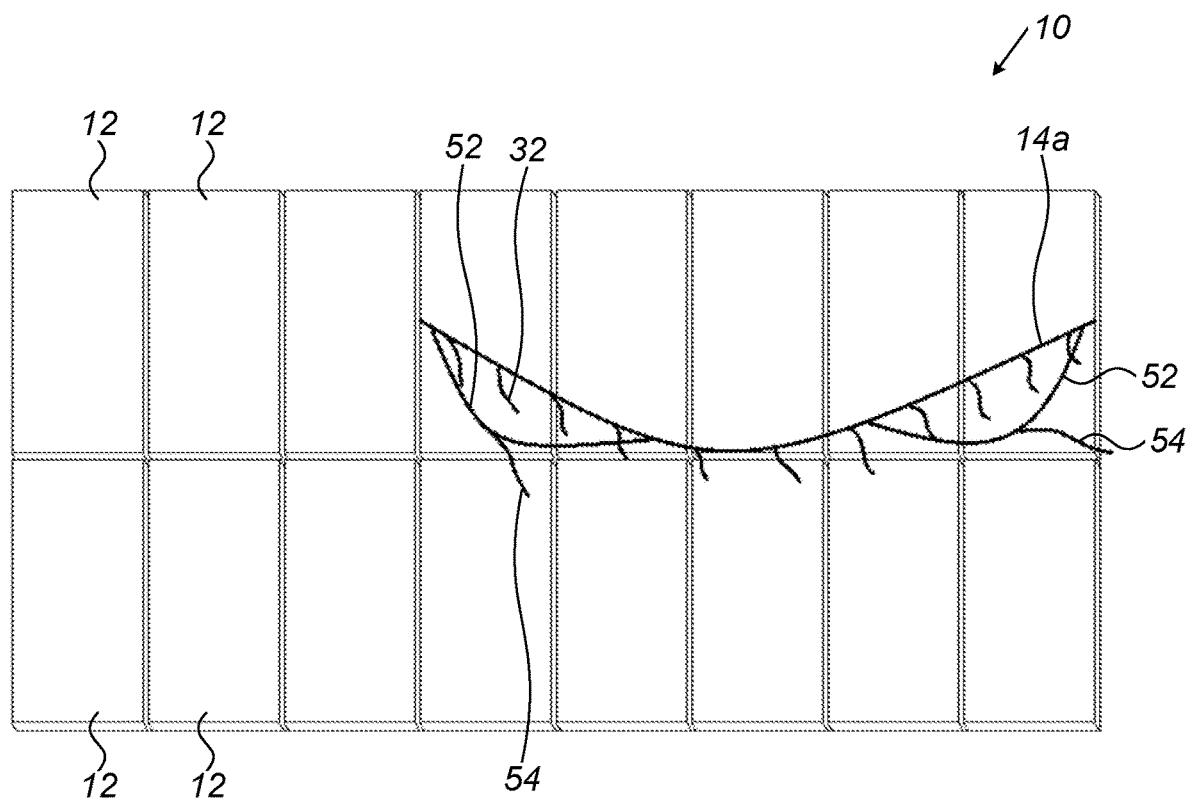
FIG. 4 is a further view similar to FIG. 1 showing a variant implementation of the cleaning device.
Figure 5:
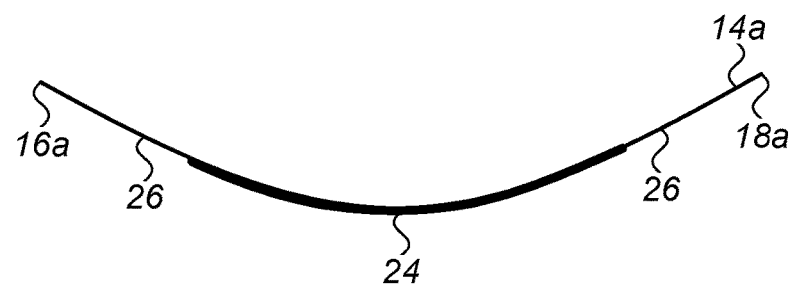
FIG. 5 is a schematic side view of a strip from the cleaning device of FIG. 1 according to certain implementations of the present invention.

A further option for enhancing the reach of the device of the present invention particularly near the anchoring locations is illustrated in FIG. 4. In this case, in addition to branch strips 32, or as an alternative thereto, the main strip 14a also serves as a support for one or more branch loops 52 which are connected at both their ends to the main strip. This arrangement defines additional "lobes" of area which can be reached by the device during its wind-driven motion, thus allowing the arch-like coverage profile to be extended, particularly to cover more of the panels that are near the anchoring locations of the main strip. Optionally, branch loops 52 may themselves support additional branch strips 54 to further extend the area reached by the device. Parenthetically, it will be understood that the device of FIG. 4 is shown in isolation for clarity of presentation, but that the device may in fact be used with one or more additional devices, which may be similar to that shown here, or may be according to any other of the device implementations shown herein, to supplement the overall cleaning area coverage in the system according to the dimensions of the array to be cleaned.

In certain cases, where the layout of the solar panel array allows, it may be preferable to anchor the ends of strip 14a at a location outside (beyond) the array of solar panels. Thus, for example, if anchored roughly one panel-width beyond the end of a row of panels, the relatively ineffective end portion of the strip lies outside the surface to be cleaned.

It should also be noted that the anchoring of the devices of the present invention need not be between locations which are at the same horizontal level. For example, in a case of an array in which panels are located one above another, it may be advantageous in some cases to have the devices spanning the heights of multiple panels, with each strip cleaning one or more column of panels.

Figure 6:
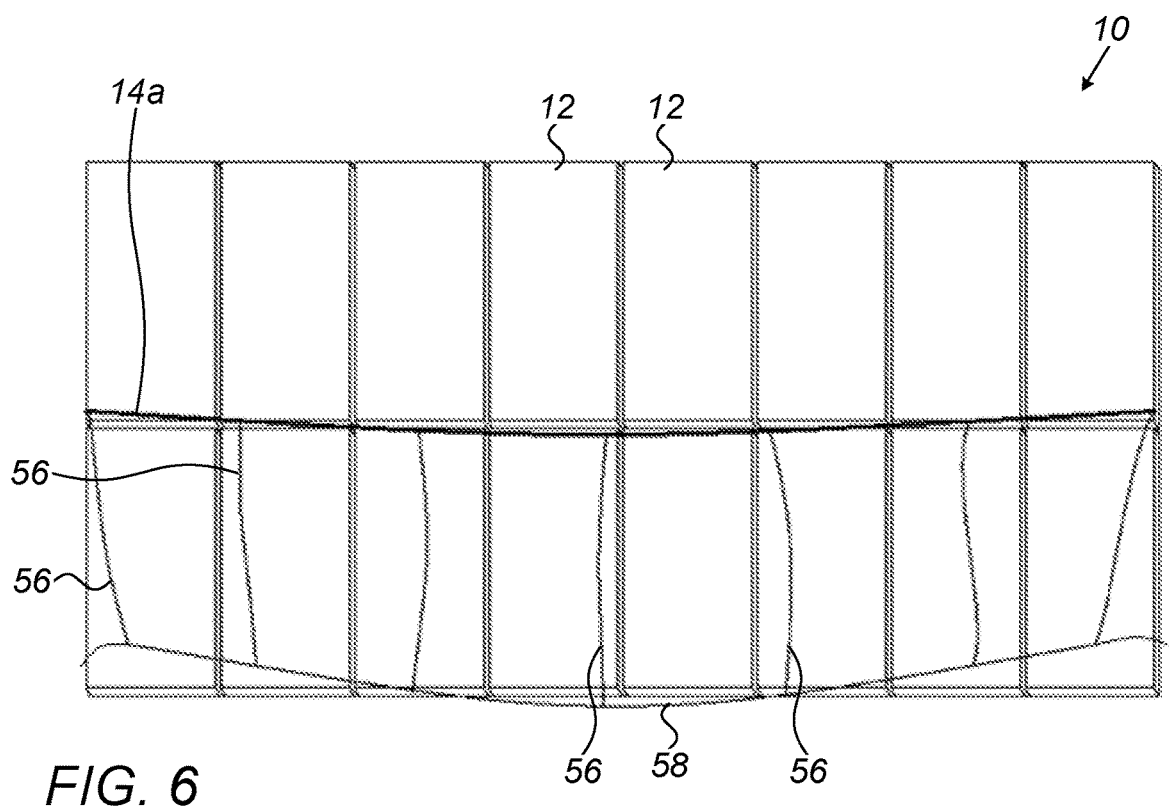
FIGS. 6 and 7 are schematic views similar to FIG. 1 showing further variant embodiments of the present invention.
Figure 7:
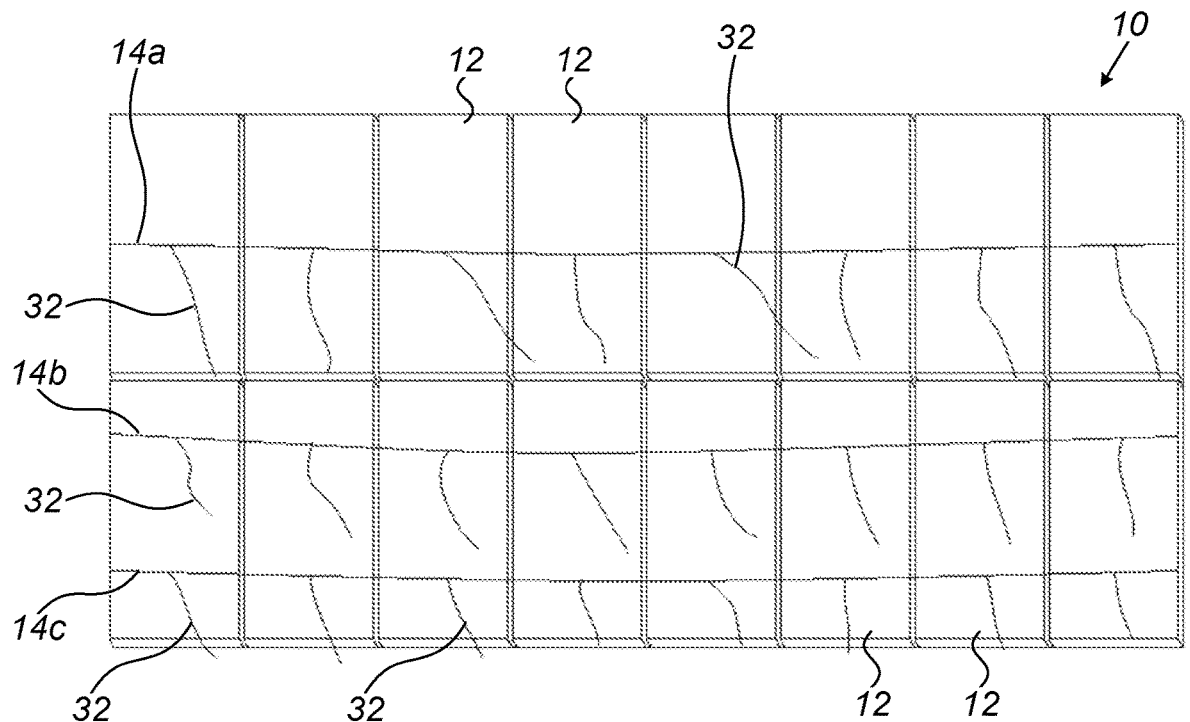

Turning now to FIGS. 6 and 7, while it is thought to be particularly advantageous to employ the "loosely hanging" configurations of the embodiments described thus far in which the free length of the strip is greater than the distance between the anchoring locations, it should be noted that the present invention is not limited to such implementations. By way of further non-limiting examples, these drawings illustrate additional options according to which strip 14a is stretched relatively taught, and is used as a suspension system for supporting additional panel cleaning elements.

In the case of FIG. 6, strip 14a supports a number of vertical strips 56 which are interconnected by one or more horizontal strip 58. Other than anchoring to strip 14a, strips 56 and 58 are untethered, and can freely move left and right, and invert upwards, all according to the wind conditions.

FIG. 7 illustrates a further case in which the branch strips 32 become the primary cleaning elements, suspended from relatively taught strips 14a, 14b and 14c.

The configurations of FIGS. 6 and 7 still maintain the functionality discussed above, namely, allowing the device to be deployed rapidly and easily across multiple solar panels in an array.

At this stage, the use of devices according to the present invention, corresponding to methods of the present invention, will be clear. The user selects a device or devices according to the invention (any combination of the features and options described above) of one or more lengths suitable to provide cleaning for the dimensions of a given array of solar panels, which may be a one-dimensional array (i.e., a single row) as exemplified in FIGS. 1-2B, or may be a two-dimensional array as exemplified in FIGS. 2C, 4, 6 and 7. The number and length of the devices to be employed are preferably chosen according to a layout planned to provide effective cleaning of a majority of the solar-collecting surface of the array, taking into consideration the effective cleaning "footprint" of each device, and a desired extent of overlap between devices. The planned layout may employ a single row of devices, or two or more rows.

Particularly for single-row solar panel arrays, a simple and standardized "layout" can be adopted, for example, such as that of FIG. 1, with a given span and degree of overlap for most of the length of the row, optionally modified by use of shorter spans at the ends of the row to enhance coverage in the non-overlapping end region. In the non-limiting example illustrated here, the devices for deployment along the main part of the row span 7 panels, and are deployed with 2 panel overlap, while the "end" devices span 3 panels, and are deployed with a one panel overlap. Thus, a kit for deployment of the system along an array may include two types of device: "mid-row" devices and "end" devices. The "end" devices are optionally modified by addition of any of the options described above for enhancing cleaning coverage of the end regions, either integrated with the device or as separately deployable supplements, all as described above.

Where the strip forming the main part of the device is provided in sections longer than required for each device, for example, as a continuous roll, the strip can be cut to length as needed during deployment of the device.

During deployment, the user passes along the array, fastening each strip at the corresponding first and second anchoring locations according to any suitable attachment arrangement, and ensuring that the free length of the strip between the anchoring locations provides the desired degree of slack to give the desired area coverage.

To the extent that the appended claims have been drafted without multiple dependencies, this has been done only to accommodate formal requirements in jurisdictions which do not allow such multiple dependencies. It should be noted that all possible combinations of features which would be implied by rendering the claims multiply dependent are explicitly envisaged and should be considered part of the invention.

It will be appreciated that the above descriptions are intended only to serve as examples, and that many other embodiments are possible within the scope of the present invention as defined in the appended claims.

What is claimed is:

1. A method for cleaning at least one solar-collecting surface, the method comprising the steps of:
    (a) providing an elongated flexible element comprising a first strip supporting a plurality of branch strips spaced apart along a length of the first strip, said branch strips being integrally formed with the first strip as contiguous regions of a sheet of material;
    (b) anchoring a first region and a second region of the flexible element relative to the at least one solar-collecting surface so that a portion of the flexible element between the first and second regions spans the at least one solar-collecting surface,
wherein a cross-section through said first strip perpendicular to the length has a width measured along a largest dimension of the cross-section and a thickness measured perpendicular to the width, the thickness being less than one fiftieth of the width along a majority of the width of the cross-section,
and wherein the portion of the flexible element is configured to be wind-displaceable so as to contribute to cleaning of the at least one solar-collecting surface.

2. The method of claim 1, wherein the first strip includes a longitudinal reinforcement extending along an entire length of the portion of the strip between the anchoring locations.

3. The method of claim 2, wherein the longitudinal reinforcement is implemented as a region of increased thickness integrally formed with the first strip, the region of increased thickness having a rounded cross-sectional shape having a diameter at least twice a minimum thickness of the first strip.

4. The method of claim 2, wherein the longitudinal reinforcement is implemented as a reinforcing filament coextensive with and interconnected with the first strip.

5. The method of claim 1, wherein the portion of the first strip between the anchoring locations includes a medial part interconnected at both ends by a connecting portion to the anchoring locations, wherein the medial part has a first cross-sectional shape, and wherein the connecting portions have a modified cross-sectional shape differing from the first cross-sectional shape.

6. The method of claim 1, wherein the flexible element is anchored with a length of the flexible element between the anchoring locations sufficient to allow a range of motion of the flexible element that reaches a majority of the solar collecting area of at least two of the solar-collecting surfaces.

7. The method of claim 1, wherein the flexible element is anchored with a length of the flexible element between the anchoring locations sufficient such that, when the flexible element hangs in a smooth curve between the anchoring locations, the flexible element reaches a lower edge of the solar collecting area of at least one of the solar-collecting surfaces and, when inverted to an upwardly deflected smooth curve, the flexible element reaches an upper edge of the solar collecting area of at least one of the solar-collecting surfaces.

8. The method of claim 1, wherein the flexible element is anchored with a length of the flexible element between the anchoring locations sufficient such that, when the flexible element hangs in a smooth curve between the anchoring locations, at least part of the flexible element lies beyond a lower edge of the solar collecting area of at least one of the solar-collecting surfaces.

9. The method of claim 1, wherein the flexible element is referred to as the first flexible element, the method further comprising anchoring first and second regions of a second flexible element relative to an array of at least three of the solar-collecting surfaces, wherein said first flexible element spans at least two panels said second flexible element spans at least two solar-collecting surfaces, and wherein the spans of said first and second flexible elements overlap by an overlap length, said overlap length being at least one solar-collecting surface width, no more than half the span of the first flexible element and no more than half the span of the second flexible element.

10. A system comprising:
    (a) at least one solar-collecting surface; and
    (b) an elongated flexible element comprising a first strip supporting a plurality of branch strips spaced apart along a length of the first strip, said branch strips being integrally formed with the first strip as contiguous regions of a sheet of material, said elongated flexible element being anchored relative to said solar-collecting surface at a first region and a second region so that a portion of said flexible element between the first and second regions spans said solar-collecting surface,
wherein a cross-section through said first strip perpendicular to the length has a width measured along a largest dimension of the cross-section and a thickness measured perpendicular to the width, the thickness being less than one fiftieth of the width along a majority of the width of the cross-section,
and wherein the portion of the flexible element is configured to be wind-displaceable so as to contribute to cleaning of said at least one solar-collecting surface.

11. The system of claim 10, wherein said first strip is a translucent strip.

12. The system of claim 10, wherein the first strip includes a longitudinal reinforcement extending along an entire length of the portion of the first strip between the anchoring locations.

13. The system of claim 12, wherein the longitudinal reinforcement is implemented as a region of increased thickness integrally formed with the first strip, the region of increased thickness having a rounded cross-sectional shape having a diameter at least twice a minimum thickness of the first strip.

14. The system of claim 12, wherein the longitudinal reinforcement is implemented as a reinforcing filament coextensive with and interconnected with the first strip.

15. The system of claim 10, wherein the portion of the first strip between the anchoring locations includes a medial part interconnected at both ends by a connecting portion to the anchoring locations, wherein the medial part has a first cross-sectional shape, and wherein the connecting portions have a modified cross-sectional shape differing from the first cross-sectional shape.

16. The system of claim 10, wherein a length of the flexible element between the anchoring locations is sufficient to allow a range of motion of the flexible element that reaches a majority of the solar collecting area of at least two of said solar-collecting surfaces.

17. The system of claim 10, wherein a length of the flexible element between the anchoring locations is sufficient such that, when the flexible element hangs in a smooth curve between the anchoring locations, the flexible element reaches a lower edge of the solar collecting area of at least one of the solar-collecting surfaces and, when inverted to an upwardly deflected smooth curve, the flexible element reaches an upper edge of the solar collecting area of at least one of the solar-collecting surfaces.

18. The system of claim 10, wherein a length of the flexible element between the anchoring locations is sufficient such that, when the flexible element hangs in a smooth curve between the anchoring locations, at least part of the flexible element lies beyond a lower edge of the solar collecting area of said at least one solar-collecting surface.

19. The system of claim 10, wherein the flexible element is referred to as the first flexible element, the system further comprising a second flexible element anchored relative to an array of at least three of said solar-collecting surfaces, wherein said first flexible element spans at least two of said solar-collecting surfaces and said second flexible element spans at least two of said solar-collecting surfaces, and wherein the spans of said first and second flexible elements overlap by an overlap length, said overlap length being at least one solar-collecting surface width, no more than half the span of the first flexible element and no more than half the span of the second flexible element.

20. A device for cleaning at least one solar-collecting surface comprising:
  (a) an elongated translucent first strip;
  (b) an anchoring arrangement for anchoring said first strip to the at least one solar-collecting surface at spaced-apart first and second regions so that a portion of the first strip between the first and second regions spans the solar-collecting surface,
wherein the portion of the first strip is configured to be wind-displaceable so as to contribute to cleaning of the at least one solar-collecting surface, and wherein the first strip supports a plurality of branch strips spaced apart along a length of the strip, said branch strips being integrally formed with the first strip as contiguous regions of a sheet of material,
and wherein a cross-section through the first strip perpendicular to the length has a width measured along a largest dimension of the cross-section and a thickness measured perpendicular to the width, the thickness being less than one fiftieth of the width along a majority of the width of the cross-section.

21. The device of claim 20, wherein said branch strips are integrally formed with the first strip as a cut roll of translucent material.

22. The device of claim 20, wherein the first strip includes a longitudinal reinforcement extending along an entire length of the portion of the first strip between the anchoring locations.

23. The device of claim 22, wherein the longitudinal reinforcement is implemented as a region of increased thickness integrally formed with the first strip, the region of increased thickness having a rounded cross-sectional shape having a diameter at least twice the minimum thickness of the first strip.

24. The device of claim 22, wherein the longitudinal reinforcement is implemented as a reinforcing filament coextensive with and interconnected with the first strip.

* * * * *